United States Patent [19]

Fowks

[11] Patent Number: 4,462,006

[45] Date of Patent: Jul. 24, 1984

[54] METHOD FOR STABILIZING THE RESONANCE FREQUENCY OF A RUBIDIUM FREQUENCY STANDARD

[75] Inventor: William R. Fowks, Yorba Linda, Calif.

[73] Assignee: Rockwell International Corporation, El Segundo, Calif.

[21] Appl. No.: 284,920

[22] Filed: Jul. 20, 1981

[51] Int. Cl.³ .............................................. H03L 7/26
[52] U.S. Cl. ...................................... 331/3; 331/94.1; 350/275
[58] Field of Search ............... 313/567, 568, 572, 573, 313/576, 586, 607, 628, 637, 643; 331/3, 94.1; 354/270; 364/16, 263; 250/205, 229, 578, 237 R; 350/266, 268, 275

[56] References Cited

U.S. PATENT DOCUMENTS 3,517,201 6/1970 Gilford et al. .................. 350/266 X
3,709,600 1/1973 Ganshorn ....................... 350/266 X

FOREIGN PATENT DOCUMENTS 1334222 10/1973 United Kingdom ............. 331/94.1

Primary Examiner—Stanley D. Miller
Assistant Examiner—W. R. Paxman
Attorney, Agent, or Firm—H. Fredrick Hamann; Richard A. Bachand

[57] ABSTRACT

A method and apparatus for stabilizing the resonance frequency of a rubidium frequency standard utilizes control of the intensity of the rubidium-87 lightbeam between the rubidium lamp and rubidium vapor cell. Resonance frequency stabilization is achieved by the present invention by providing adjustment of pumping light intensity until the sensitivity of resonance frequency to changes in cell temperature is minimized and the cell operating temperature is at its turning point, that is, where resonance frequency shift versus temperature goes through a zero slope. By utilizing the invention, the light crossover point, that is, a point of convergence of the family of curves of frequency deviation versus temperature for different levels of rubidium lamp excitation discharge current, can be set equal to the cell turning point. A preferred embodiment of an apparatus for carrying out the method comprises a planar plate positioned between the lamp and the cell and having an aperture aligned with the lightbeam and including adjustable means, such as a threaded opaque object, for partially blocking the lightbeam to selected degrees by decreasing the area of the aperture.

11 Claims, 8 Drawing Figures

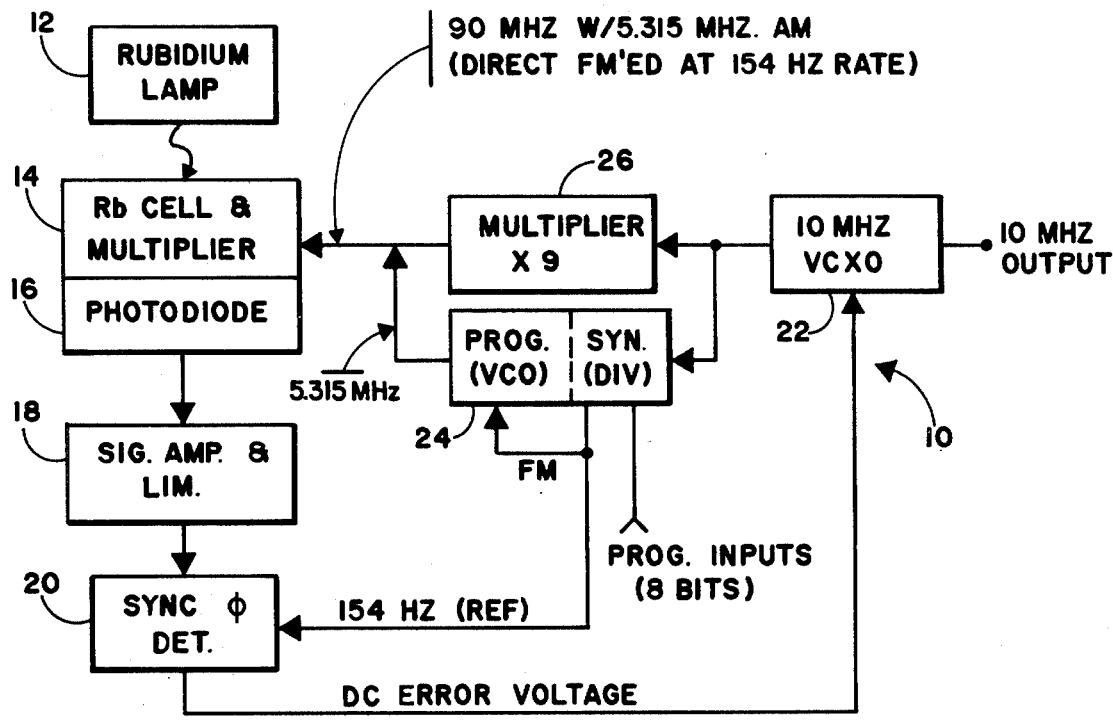
FIG. 1
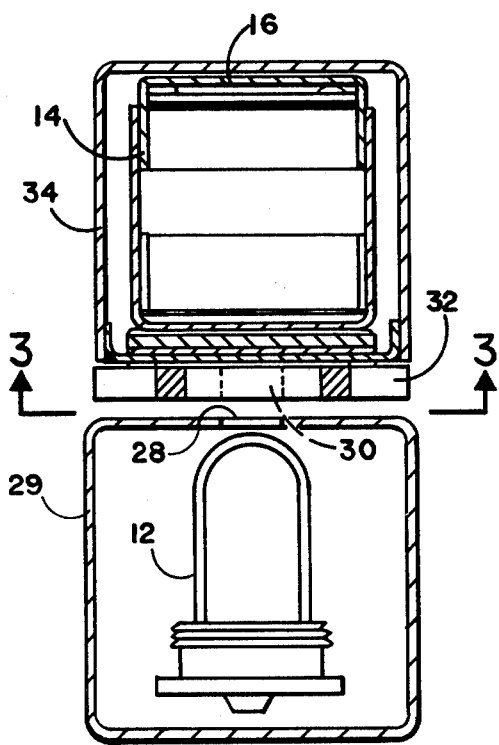
FIG. 2
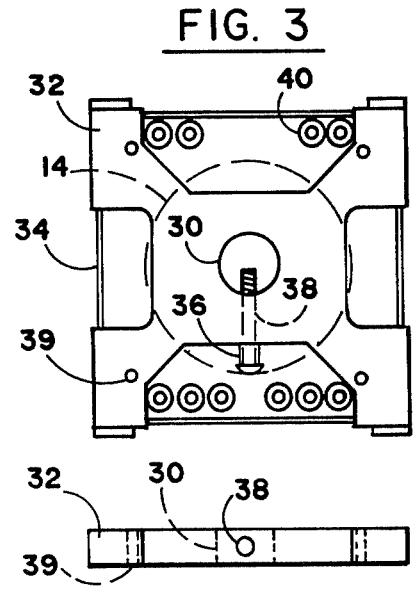
FIG. 3
FIG. 4

METHOD FOR STABILIZING THE RESONANCE FREQUENCY OF A RUBIDIUM FREQUENCY STANDARD

BACKGROUND OF THE INVENTION

1. Field of the Invention

The present invention pertains generally to rubidium frequency standards of the type that use a rubidium vapor lamp as an optical pumping source of a rubidium cell to excite hyperfine transition frequency resonance and more specifically, to an improved method for operating the combination of the rubidium vapor lamp and rubidium cell to provide a more stabilized resonance frequency.

2. Prior Art

Rubidium vapor cell frequency standards are described extensively in the literature. For example, reference may be had to the texts respectively entitled "Frequency and Time" by P. Kartaschoff, Academic Press, 1978; and "Frequency Synthesizers Theory and Design", Second Edition, By Vadim Manassewitsch, John Wiley and Sons, 1980. Such frequency sources are stabilized by quantum mechanical atomic state transition resonances such as the hyperfine atomic resonance frequency related to the change in the internal energy of the atom. The rubidium frequency standard operates as a discriminator, based upon the energy absorption characteristics of rubidium-87. In practice a rubidium lamp passes a lightbeam into a rubidium absorption cell. The rubidium cell absorbs some of the light energy because of the energy level transitions in the rubidium-87 gas. When an electromagnetic field of frequency equal to the resonance frequency of the rubidium vapor is applied to the vapor cell the number of energy level transitions in the rubidium-87 gas is increased and more of the light emitted by the rubidium lamp is absorbed by the rubidium vapor cell. Typically, a photodiode is used to detect the occurrence of the maximum absorption of light from the rubidium lamp which occurs when the frequency of the excitation electromagnetic field exactly matches the rubidium resonance frequency. Typically, a frequency synthesizer is used to generate the appropriate electromagnetic field of frequency of approximately 6,834.685 MHz. This field is modulated at a relatively slow rate (i.e. 154 Hz.) so that the photodiode provides a demodulated signal which may be applied to a phase detector or comparator which also receives the reference modulation signal. The output of the phase comparator is a DC error voltage which is used to control a voltage controlled crystal oscillator at a selected frequency, typically of 5 or 10 MHz. In this manner the frequency of the crystal controlled oscillator is stabilized to approximately one part in $10^{11}$ or better over long periods of time to provide a highly stable and accurate frequency source.

The rubidium-87 resonance frequency is nominally 6.834682614 GHz. plus or minus 3 Hz. However, this frequency is subject to change due to variations in the gas mixture and pressure of the rubidium vapor in combination with well-known buffer gases, as well as temperature variations and magnetic field variations in the cell. Furthermore, the resonance frequency of a rubidium frequency standard is highly dependent upon a shift in the light characteristics of the incident rubidium beam generated by the rubidium vapor lamp.

In co-pending applications assigned to the assignee of the present invention, applicant discloses a number of inventions designed to improve the frequency stability of an atomic clock stabilized crystal oscillator. By way of example, in one such co-pending application, Ser. No. 285,200, filed July 20, 1981, applicant has disclosed a method for operating the rubidium vapor lamp to stabilize the resonance frequency of the standard with variations in temperature of the lamp, and in another co-pending patent application, Ser. No. 285,199, filed July 20, 1981, applicant discloses a novel voltage variable crystal controlled oscillator also having decreased sensitivity to temperature variations.

SUMMARY OF THE INVENTION

The present invention relates to a method of operating the combination of the rubidium lamp and rubidium vapor cell which provides a substantial improvement in resonance frequency that would otherwise be adversely affected by variations in the operating temperature of the rubidium cell. More specifically, applicant has discovered that by controlling the level of light intensity of the rubidium lightbeam between the lamp and the cell, one may vary the cell operating characteristics to permit selection of a cell temperature at which the resonance frequency remains extremely stable with changes in temperature. As a result of the present invention it has been found that the rubidium vapor cell exhibits a temperature turning point at different temperatures depending upon the intensity of the rubidium light. As a result, it is possible to generate a family of curves which permits the selection of the cell temperature and the best light intensity for that temperature for maximum frequency stability. One may, using the present invention, select a cell temperature at which all of the curves of resonance frequency deviation versus temperature converge at a light crossover point at which the resonance frequency deviation is minimized. Thus by using the invention to adjust light intensity to normalize the cell temperature at both the cell temperature turning point and the light crossover point, the variation in cell frequency with temperature may be reduced to something less than 5 parts in $10^{11}$ over a 4 degrees C. temperature range with the lowest frequency deviation in the middle of this range. As a result, with reasonable thermal isolation and a high gain temperature control loop the cell temperature can be held to within about 1 degree C. despite the variation in environmental extremes to which the frequency standard is subjected and thus achieve virtually absolute resonance frequency stability with regard to the rubidium vapor cell.

In one embodiment of an apparatus disclosed herein for carrying out the method of the present invention, a tapped hole is drilled in a support plate located between the rubidium lamp and the rubidium vapor cell and a screw is adjustably inserted into the light path of the rubidium beam to provide sufficient range in resolution of light intensity control.

OBJECTS

It is therefore a primary object of the present invention to provide a method of operating a rubidium frequency standard with improved stability of the atomic transition resonance frequency.

It is an additional object of the present invention to provide an improved method of stabilizing the resonance frequency of a rubidium frequency standard that would otherwise vary in response to a change in the operating temperature of the rubidium vapor cell.

It is still a further object of the present invention to provide a method of stabilizing the resonance frequency of a rubidium frequency standard which method includes the step of mechanically controlling the light intensity of the rubidium-87 lightbeam between the rubidium lamp and the rubidium vapor cell.

It is still a further object of the present invention to provide a method of stabilizing the resonance frequency of a rubidium frequency standard. The method comprises the step of adjusting the area of an aperture between the rubidium lamp and rubidium vapor cell to achieve a light crossover point which allows selection of a cell temperature at which the cell resonance frequency is relatively insensitive to changes in temperature.

It is still a further object of the present invention to provide an apparatus for controlling the lightbeam intensity of a rubidium vapor lamp generated beam of rubidium-87 light incident on a rubidium vapor cell for minimizing the effects of cell temperature variations on the resonance frequency of a rubidium frequency standard.

BRIEF DESCRIPTION OF THE DRAWINGS

The aforementioned objects and advantages of the present invention, as well as additional objects and advantages thereof, will be more fully understood hereinafter as a result of the detailed description of the preferred embodiment of the present invention when taken in conjunction with the accompanying drawings in which:

FIG. 1 is a simplified block diagram of a rubidium frequency standard which is used to explain the application of the present invention;

FIG. 2 is a partially cut away plan view of a rubidium lamp and a rubidium vapor cell separated by a light control apparatus for carrying out the method of the present invention;

FIG. 3 is a plan view of the light control apparatus and rubidium vapor cell of FIG. 2 taken along lines 3—3 of FIG. 2;

FIG. 4 is a bottom view of the light control apparatus of FIGS. 2 and 3 further illustrating mechanical details thereof;

DETAILED DESCRIPTION OF A PREFERRED EMBODIMENT

Figure 5:
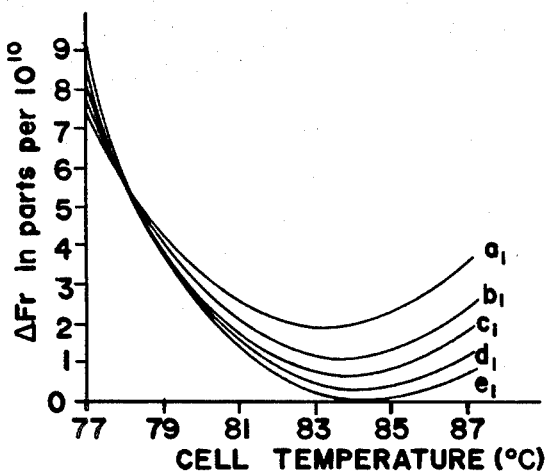
FIG. 5 is a graphical illustration of a family of curves of resonance frequency deviation with cell temperature for different light intensities of too great a magnitude.

Referring to FIG. 1 there is shown a simplified block diagram of a rubidium frequency standard 10. More specifically and as is well-known in the art, the rubidium frequency standard 10 utilizes a rubidium lamp 12 to generate a beam of light. The lightbeam is directed through a rubidium vapor cell and multiplier 14 and is incident upon a photodiode 16. The output of the photodiode is connected to a signal amplifier and limiter 18 which is in turn connected to a synchronous phase detector 20. Synchronous phase detector 20 develops a DC error voltage which is applied to a 10 MHz. voltage controlled crystal oscillator 22 to adjust the precise frequency thereof. Crystal oscillator 22 provides a nominal 10 MHz. output signal which is the externally accessible output of the rubidium frequency source 10. Crystal oscillator 22 also provides output signals to a programmable frequency synthesizer 24 and to a X9 frequency multiplier 26.

Synthesizer 24 generates a phase locked 154 Hz. periodic signal that is applied as a reference signal to synchronous phase detector 20 and which is also applied as a frequency modulating signal to a phase locked voltage controlled oscillator internal to the synthesizer. The output of this internal voltage controlled oscillator is a periodic signal of approximately 5.315 MHz. which is summed with the 90 MHz. output signal of multiplier 26. That combination of signals is applied to rubidium cell and multiplier 14. The lower sideband of the 76th harmonic of the 90 MHz. signal output of multiplier 26 (amplitude modulated by the 5.315 MHz. output of the synthesizer), generated by the non-linear characteristic of a snap diode multiplier, corresponds to the approximate resonance frequency of the hyperfine atomic state transition of the rubidium cell.

As is well-known in the art to which the present invention pertains, when the frequency of the applied electromagnetic field matches the resonance frequency of the rubidium cell, the maximum number of energy transitions occur and the maximum absorption of rubidium-87 light is produced in the rubidium cell. Accordingly, the effect of the 154 Hz. frequency modulation of the lower sideband of the 90 MHz. output of multiplier 26, amplitude modulated by the 5.315 MHz. output of the synthesizer 24, is a photodiode output signal which is composed of a combination of a 154 Hz. fundamental frequency and a second harmonic at a frequency of 308 Hz. As is well-known in the art, when the resonance frequency of the rubidium cell is matched precisely by the frequency of the applied electromagnetic radiation, the fundamental modulation frequency of 154 Hz. is, in effect, zeroed out and only the 308 Hz. second harmonic remains. On the other hand, if precise matching of the frequency of the electromagnetic radiation and the resonance of the cell is not achieved, the fundamental modulation frequency at 154 Hz. is produced by the photodiode, with a phase dependent upon whether the frequency of the applied electromagnetic radiation is above or below the resonance frequency of the cell. The photodiode output signal is applied to the signal amplifier and limiter 18 and thereafter to synchronous phase detector 20. Detector 20 compares the photodiode output signal with a 154 Hz. reference signal derived from frequency synthesizer 24. The detector thus provides a DC error voltage, the magnitude of which may be used to accurately track the frequency of the 10 MHz. voltage controlled crystal oscillator 22 to the resonance frequency of the rubidium cell.

As further indicated in FIG. 1, programmable frequency synthesizer 24 includes provision for programmable inputs comprising 8 bits of binary code for controlling the frequency thereof. Typically, the 8 bits of binary code applied to the synthesizer for controlling its output frequency may be used to compensate for relatively slight variations of rubidium vapor cell resonance frequency from the aforementioned ideal resonance frequency and also to permit variations of the time scale of the atomic frequency standard for correcting for differences between atomic time and ephermeris time for a fixed rubidium vapor cell resonance frequency in atomic clocks. However, in all such synthesizer frequency adjustments it is assumed that the resonance frequency remains stable to approximately one part in $10^{11}$ or better. However, this assumption can only be made with any degree of assurance if all of the various factors which contribute to frequency instability are accounted for and accommodated. Among these factors is the sensitivity of the rubidium vapor cell resonance frequency to even slight changes in the temperature of the rubidium vapor cell. It will be seen hereinafter that the present invention provides a method and apparatus for minimizing this sensitivity whereby the temperature may be allowed to vary over a range of + or −1 or 2 degrees C. from the preferred nominal temperature of the cell without substantially affecting the resonance frequency.

Reference will now be made to FIGS. 2 through 4 which illustrate an exemplary novel apparatus for carrying out the method of the present invention. More specifically, in FIG. 2 there is shown a rubidium lamp 12 oriented to project a lightbeam into rubidium cell and multiplier 14 which absorbs rubidium-87 light in accordance with the resonance frequency of the electromagnetic field applied thereto. This absorption phenomenon is detected by a photodiode 16 which is oriented at the opposite end of the cell from rubidium lamp 12. The lightbeam produced by the rubidium lamp exits through an aperture 28 in a modular housing 29 enclosing the lamp and associated structure and circuits (not shown). The lightbeam then passes through an aperture 30 of a light intensity control plate 32 oriented between the rubidium lamp 12 and the cell 14. Cell 14 and associated circuitry and structure (not shown) are enclosed within a protective modular housing 34 except for an aperture aligned with aperture 30 of plate 32 and aperture 28 of housing 29 to permit the lightbeam to enter the cell.

In the embodiment illustrated in FIG. 2 plate 32 is actually fastened to the light entrance face of cell housing 34. This is shown best in FIG. 3 where it is seen that the plate 32 is substantially rectangular in shape with a plurality of cut-away portions adapted to minimize the weight of the plate and to provide access to a plurality of electrical terminals 40 mounted to the face of cell housing 34. Plate 32 may be fastened to cell housing 34 by utilizing suitable screws (not shown) placed in a plurality of apertures 39 in plate 32 which will of course have matching apertures in the face of cell housing 34. As also seen best in FIG. 3, aperture area variation of aperture 30 of plate 32 is accomplished by means of a common machine screw 36 protruding through the bottom cut-away portion of plate 32 through a screw hole 38 which is threaded to receive the screw 36. Screw 36 may of course be adjustably located within screw hole 38 to protrude to varying selected degrees into aperture 30 to provide a means for controlling the area thereof and therefore provides a means for reducing the level of light intensity available from rubidium lamp 12 and incident upon rubidium vapor cell 14 in very fine continuous increments. The bottom view of plate 32 provided in FIG. 4 indicates the relatively centered location of screw hole 38 relative to plate 32 for receiving the screw 36.

The advantageous utilization of the method and apparatus of the present invention will be more fully understood hereinafter as a result of the following description of the graphs of FIGS. 5 through 8. More specifically, FIG. 5 is a graph of cell resonance frequency deviation versus cell temperature for five different levels of rubidium vapor lamp intensity as determined by the lamp discharge excitation. In the graph of FIG. 5 no blockage of aperture 30 of plate 32 was employed. In other words, the full level of light intensity available from rubidium lamp 12 was permitted to reach the rubidium cell 14 as disclosed previously in conjunction with FIGS. 2, 3 and 4. Curve $a_1$ of FIG. 5 corresponds to the lowest discharge excitation and curve $e_1$ corresponds to the highest discharge excitation. As shown in FIG. 5, all five intensity curves $a_1$ through $e_1$ experience a slope polarity change between approximately 83 degrees C. and 85 degrees C. as the temperature of the cell is varied. The point of zero slope is defined herein as the cell temperature turning point. As a result of the characteristics of the graph of FIG. 5 it will be understood that the lack of any aperture area reduction results in a number of disadvantages. More specifically, irrespective of the lamp discharge excitation, the light crossover point is high (i.e., approximately 5.5 parts in $10^{10}$) and the slope of the curves are all too high at temperatures near the light crossover point (i.e., approximately 78 degrees C.). As a result, the cell heating circuit would have to be capable of very precise control to maintain the temperature at the light crossover where it is preferred because the sensitivity of the cell resonance frequency to a change in light intensity near the turning point would be too high. For example, a change in cell temperature below the light crossover point of curve $e_1$ of only 2 degrees C. would result in a resonance frequency shift of approximately 4 parts in $10^{10}$.

Figure 6:
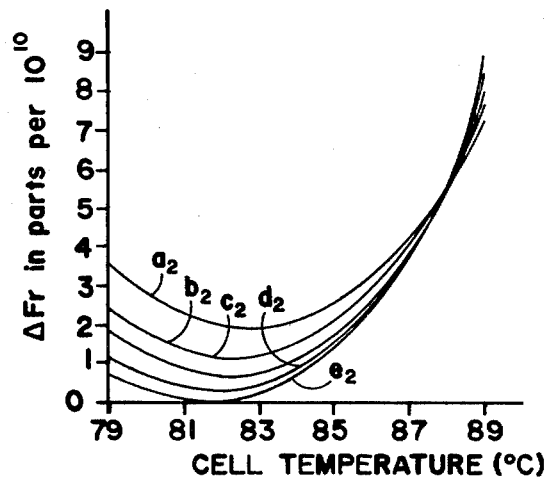
FIG. 6 is a graphical illustration of a family of curves of resonance frequency deviation versus cell temperature for different light intensities of which the magnitude is too low.

The graph of FIG. 6 illustrates the same five discharge excitation curves as discussed in conjunction with FIG. 5, but with the area of aperture 30 of plate 32 as seen in FIG. 3 reduced to the minimum possible by means of screw 36 being positioned as far as possible into screw hole 38. It is seen that FIG. 6 is essentially a mirror image of FIG. 5 and accordingly all of the disadvantages noted for the curves of FIG. 5 occur for the curve of FIG. 6 as well.

Figure 7:
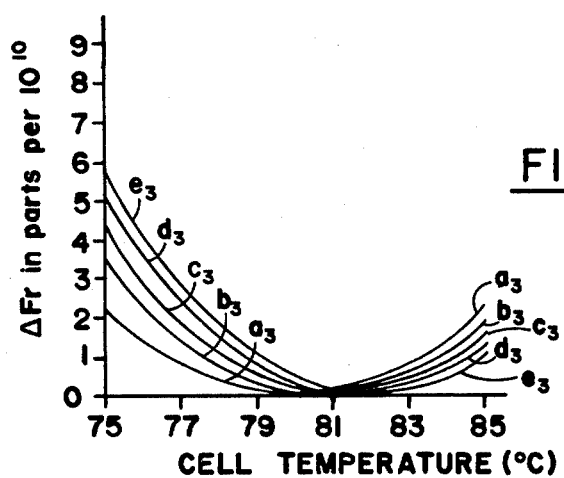
FIG. 7 is a graphical illustration of a family of curves of resonance frequency deviation versus cell temperature of different light intensities where the magnitude is adjusted to provide the desired light crossover point.
Figure 8:
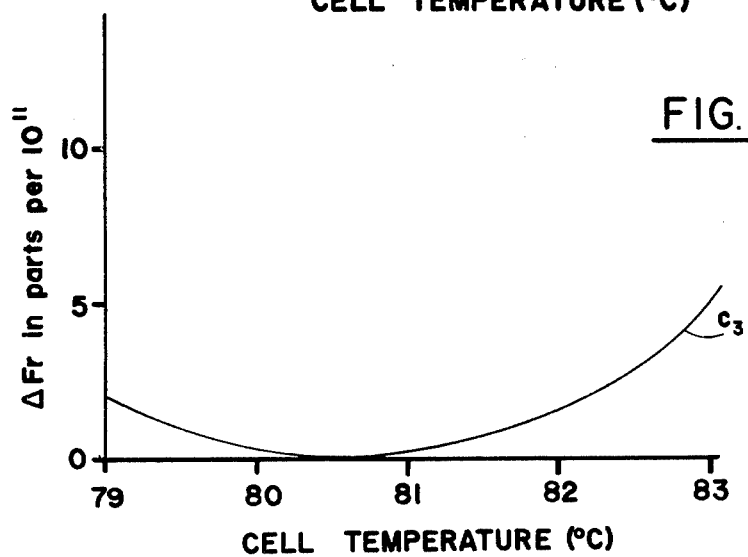
FIG. 8 is an enlarged scale graphical illustration of the preferred light density curve of FIG. 7 illustrating the advantageous stability characteristic achieved by the present invention.

As a result of the discussions of both FIGS. 5 and 6 it will now be clear that operating the rubidium lamp and rubidium vapor cell in accordance with the graph of FIG. 5 provides too much light intensity, while operating in accordance with the graph of FIG. 6 provides too little light intensity. On the other hand, the graph of FIG. 7, which corresponds to an aperture area provided by adjusting screw 36 to protrude into aperture 30 to an extent between the limits corresponding to the graphs of FIGS. 5 and 6, illustrates the highly advantageous results obtained by means of the present invention. More specifically, it is seen in the graph of FIG. 7 that the light crossover point and the cell temperature turning point for all levels of vapor lamp discharge excitation, coincide at a temperature just below 81 degrees C. As a result, the present invention renders resonance frequency virtually insensitive to variations in light intensity due to the lamp per se. Furthermore, the slope of the curve of the excitation level corresponding to curve $c_3$ particularly, is relatively low on both sides of the turning point temperature. This advantageous result is readily apparent from the enlarged scale graph of FIG. 8 which illustrates the $c_3$ curve characteristic between the temperatures of 79 degrees and 83 degrees C. more clearly. It is to be noted that the vertical axis of the graph of FIG. 8 corresponds to resonance frequency shift in parts per $10^{11}$. As a result, the ordinate value of 10 parts in the graph of FIG. 8 corresponds to the ordinate value of 1 part in the graph of FIG. 7. As a result of the graph of FIG. 8 it will be seen that is now possible by setting the cell temperature to approximately 81 degrees C., to vary the cell temperature plus or minus 2 degrees from that point without affecting the resonance frequency shift by more than 5 parts in $10^{11}$. Furthermore, it will be understood by those having skill in the art to which the present invention pertains, that with a suitable amount of thermal isolation and a high gain temperature control loop, the cell temperature can be readily controlled within a range of 1 degree C. over the normal environmental extremes encountered in even a ruggedized military version of a rubidium frequency standard and that such temperature control about the cell temperature turning point achieved by means of the invention results in a resonance frequency stability of better than one part in $10^{11}$.

It will now be understood that what has been disclosed herein is a method and apparatus for stabilizing the resonance frequency of a rubidium frequency standard as a function of temperature by controlling the level of light intensity incident upon the rubidium vapor cell from the rubidium lamp. This is preferably accomplished by mechanical means interposed between the lamp and the cell. By utilizing the disclosed method it is now possible to adjust the rubidium vapor cell characteristic of resonance frequency shift versus cell temperature to provide a cell temperature turning point virtually coincident with the light crossover point at an advantageous operating temperature and to also provide a frequency resonance stability with varying temperature and lamp discharge excitation that constitutes a substantial improvement over prior art devices.

Although a particular apparatus for practicing the method of the present invention has been disclosed herein it will be understood that the method of the invention encompasses any means for controlling the light intensity between the rubidium lamp and the rubidium vapor cell in a frequency standard. By way of example, those having skill in the art to which the present invention pertains will now appreciate that the method of the present invention may be accomplished by the use of neutral density filters, mechanical irises or other such means for mechanically controlling the intensity level of light permitted to reach the cell. However, it will be understood that all such means for carrying out the present invention including the particular apparatus therefor disclosed herein, are currently contemplated to be within the scope of the invention which is to be limited only by the appended claims.

I claim:

1. A method of improving the stability of the resonance frequency of a rubidium frequency standard with variations in temperature, said frequency standard having a rubidium lamp generating a rubidium-87 lightbeam for optically pumping a rubidium vapor cell, the method comprising the steps of:

passing said lightbeam through a device for controlling the intensity of the light;

adjusting the intensity of said lightbeam with said device until the sensitivity of said resonance frequency to changes in cell temperature and light intensity is minimized by locating the point at which the change in frequency versus temperature curves for various light intensities intersect at the location at which each change in frequency versus temperature curve is minimum, and operating said cell at said point.

2. The method recited in claim 1 wherein said device has an aperture and means for varying the area of said aperture through which said light passes, and wherein said adjusting step comprises the step of varying said area.

3. The method recited in claim 2 wherein said device is a substantially planar plate located between said lamp and said cell and having a hole therethrough coaxial with said lightbeam for forming said aperture, wherein said area varying means comprises an opaque object oriented in the plane of said plate and adapted to be adjustably positioned within said aperture for varying said area, and wherein said adjusting step comprises the step of adjusting said object within said aperture for changing the area of said aperture.

4. The method recited in claim 3 wherein said opaque object is a threaded cylindrical member positioned in a correspondingly threaded cylindrical hole from the exterior of said plate extending to said aperture and oriented in the plane of said plate perpendicular to said plate hole, and wherein said adjusting step comprises the step of rotating said member in said cylindrical hole for extending said member into said aperture.

5. The method recited in claim 4 wherein said member is a screw and wherein said rotating step comprises the step of turning said screw.

6. A method of improving the stability of the resonance frequency of a rubidium frequency standard with variations in temperature, said frequency standard having a rubidium lamp excited by an electric field to produce a rubidium light discharge for optically pumping a rubidium vapor cell, the method comprising the steps of:

a. setting the excitation discharge of the lamp at a selected level, b. partially blocking the light discharge reaching the cell to a selected degree, c. monitoring the resonance frequency of the cell while varying the cell temperature to determine the resonance frequency sensitivity to temperature variations and the location at which the change in frequency versus temperature curve is minimum, d. resetting the excitation discharge of the lamp at other selected levels, to determine the location of the point at which the change in frequency versus temperature curves for various light intensities intersect, e. repeating step c. for each such selected level, f. partially blocking the light discharge reaching the cell to other selected degrees, g. repeating steps a., c., d. and e. for each such other selected degree of light blocking, and h. setting said level, said degree of light blocking, and said cell temperature to respective parameters determined in accordance with steps a. through g. by locating the point at which the change in frequency versus temperature curves for various light intensities intersect at the location at which each change in frequency versus temperature curve is minimum.

7. The method recited in claim 6 wherein step b. comprises the steps of:

passing said light discharge through a device for controlling the intensity of the light, and adjusting the intensity of said light with said device.

8. The method recited in claim 7 wherein said device has an aperture and means for varying the area of said aperture through which said light passes, and wherein said adjusting step comprises the step of varying said area.

9. The method recited in claim 8 wherein said device is a substantially planar plate located between said lamp and said cell and having a hole therethrough coaxial with said lightbeam for forming said aperture, wherein said area varying means comprises an opaque object oriented in the plane of said plate and is adapted to be adjustably positioned within said aperture for varying said area, and wherein said adjusting step comprises the step of adjusting said object within said aperture for changing the area of said aperture.

10. The method recited in claim 9 wherein said opaque object is a threaded cylindrical member positioned in a correspondingly threaded cylindrical hole from the exterior of said plate extending to said aperture and oriented in the plane of said plate perpendicular to said plate hole, and wherein said adjusting step comprises the step of rotating said member in said cylindrical hole for extending said member into said aperture.

11. The method recited claim 10 wherein said member is a screw and wherein said rotating step comprises the step of turning said screw.

* * * * *